United States Patent
Mishima et al.

(10) Patent No.: US 10,672,930 B2
(45) Date of Patent: Jun. 2, 2020

(54) PHOTOELECTRIC CONVERSION DEVICE AND PHOTOELECTRIC CONVERSION MODULE

(71) Applicant: Kaneka Corporation, Osaka (JP)

(72) Inventors: Ryota Mishima, Osaka (JP); Masashi Hino, Osaka (JP); Hisashi Uzu, Osaka (JP); Tomomi Meguro, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 15/717,294

(22) Filed: Sep. 27, 2017

(65) Prior Publication Data

US 2018/0019360 A1 Jan. 18, 2018

Related U.S. Application Data

(63) Continuation of application No. PCT/JP2016/052658, filed on Jan. 29, 2016.

(30) Foreign Application Priority Data

Mar. 31, 2015 (JP) .................. 2015-071212

(51) Int. Cl.
*H01L 31/0747* (2012.01)
*H01L 27/30* (2006.01)
(Continued)

(52) U.S. Cl.
CPC ....... *H01L 31/0747* (2013.01); *H01G 9/2009* (2013.01); *H01L 27/301* (2013.01);
(Continued)

(58) Field of Classification Search
CPC .............. H01L 31/0747; H01L 31/028; H01L 31/02363; H01L 31/02168; H01L 31/022466; H01G 9/2009
See application file for complete search history.

(56) References Cited

U.S. PATENT DOCUMENTS 4,379,943 A * 4/1983 Yang ............... H01L 31/075
136/249
5,853,497 A * 12/1998 Lillington .......... H01L 31/0687
136/249
(Continued)

FOREIGN PATENT DOCUMENTS

JP 2002319688 A 10/2002
JP 2009231781 A 10/2009
(Continued)

OTHER PUBLICATIONS

KR101386076, Machine Translation, Kwon (Year: 2013).*
(Continued)

*Primary Examiner* — Devina Pillay
(74) *Attorney, Agent, or Firm* — Osha Liang LLP (57) ABSTRACT

A tandem-type photoelectric conversion device includes, arranged in the following order from a light-incident side: a first photoelectric conversion unit; an anti-reflection layer; a transparent conductive layer; and a second photoelectric conversion unit. The first photoelectric conversion unit includes a light absorbing layer including a photosensitive material of perovskite-type crystal structure represented by general formula $R^1NH_3M^1X_3$ or $HC(NH_2)_2M^1X_3$, wherein $R^1$ is an alkyl group, $M^1$ is a divalent metal ion, and X is a halogen. The second photoelectric conversion unit includes a light absorbing layer having a bandgap narrower than a bandgap of the light absorbing layer in the first photoelectric conversion unit. The anti-reflection layer and the transparent conductive layer are in contact with each other, and a refractive index of the anti-reflection layer is lower than a refractive index of the transparent conductive layer.

11 Claims, 2 Drawing Sheets

(51) Int. Cl.
    *H01L 51/42*     (2006.01)
    *H01G 9/20*     (2006.01)
    *H01L 31/0216*     (2014.01)
    *H01L 31/0224*     (2006.01)
    *H01L 31/0236*     (2006.01)
    *H01L 31/028*     (2006.01)

(52) U.S. Cl.
    CPC ...... *H01L 31/028* (2013.01); *H01L 31/02168* (2013.01); *H01L 31/02363* (2013.01); *H01L 31/022466* (2013.01); *H01L 51/4226* (2013.01); *H01L 51/4233* (2013.01); *Y02E 10/549* (2013.01)

(56) References Cited

U.S. PATENT DOCUMENTS

| | | | |
|---|---|---|---|
| 6,278,054 B1* | 8/2001 | Ho | H01L 31/046 |
| | | | 136/255 |
| 2009/0084437 A1* | 4/2009 | Nishida | H01L 31/02245 |
| | | | 136/256 |
| 2010/0243058 A1 | 9/2010 | Meguro et al. | |
| 2012/0138126 A1* | 6/2012 | Yata | H01L 31/022466 |
| | | | 136/249 |
| 2014/0130857 A1* | 5/2014 | Narita | H01L 31/0747 |
| | | | 136/256 |
| 2014/0158189 A1* | 6/2014 | Kleiman | H01L 31/0725 |
| | | | 136/255 |
| 2014/0332078 A1* | 11/2014 | Guo | H01L 51/424 |
| | | | 136/261 |
| 2015/0249170 A1* | 9/2015 | Snaith | H01L 51/422 |
| | | | 136/256 |
| 2016/0190377 A1* | 6/2016 | Green | H01L 51/4213 |
| | | | 136/244 |

FOREIGN PATENT DOCUMENTS

| | | | | |
|---|---|---|---|---|
| JP | 2014072327 A | | 4/2014 | |
| KR | 101386076 B1 * | | 4/2014 | .......... H01L 31/042 |
| WO | 2014045021 A1 | | 3/2014 | |

OTHER PUBLICATIONS

International Search Report issued in International Application No. PCT/JP20161052658; dated Apr. 19, 2016 (2 pages).

Hodes, "Perovskite-Based Solar Cells", Science, vol. 342, Oct. 18, 2013, pp. 317-318 (2 pages).

Kojima et al., "Organometal Halide Perovskites as Visible-Light Sensitizers for Photovoltaic Cells", J. Am. Chem. Soc. Communications, 2009 (2 pages).

Hao et al., "Lead-free solid-state organic-inorganic halide perovskite solar cells", Nature Photonics, vol. 8, Jun. 2014, pp. 489-494 (6 pages).

International Preliminary Report on Patentability issued in International Application No. PCT/JP2016/052658; dated Oct. 12, 2017 (6 pages).

* cited by examiner

PHOTOELECTRIC CONVERSION DEVICE AND PHOTOELECTRIC CONVERSION MODULE

TECHNICAL FIELD

The present invention relates to a photoelectric conversion device including a combination of two or more of photoelectric conversion units having different bandgaps, and to a photoelectric conversion module including the photoelectric conversion device.

BACKGROUND ART

A solar cell utilizing an organic metal perovskite crystal material (perovskite solar cell) can provide a high conversion efficiency. A large number of reports have recently been published on improvement on conversion efficiency of a solar cell utilizing a perovskite crystal material in a light absorbing layer (e.g., Non-Patent Document 1 and Patent Document 1). The organic metal used is a compound represented by a general formula $R^1NH_3M^1X_3$ or $HC(NH_2)_2 M^1X_3$ (where $R^1$ is an alkyl group, $M^1$ is a divalent metal ion, and X is a halogen). Spectral sensitivity characteristics of the compound are known to vary depending on the halogen and/or the ratio of the halogen (e.g., Non-Patent Document 2).

A perovskite crystal material, such as $CH_3NH_3PbX_3$ (X: halogen), can be used to form a thin-film at low cost using a solution application technique, such as spin coating. Thus, attention has been directed to a perovskite solar cell utilizing such a perovskite crystal material, as a low-cost and high-efficiency next generation solar cell. Furthermore, a perovskite solar cell has also been developed that incorporates, as a light absorbing material, $CH_3NH_3SnX_3$ containing tin in place of lead (e.g., Non-Patent Document 3).

PRIOR ART DOCUMENTS

Patent Documents

Patent Document 1: JP 2014-72327 A

Non-Patent Documents

Non Patent Document 1: G. Hodes, *Science*, 342, 317-318 (2013).
Non Patent Document 2: A. Kojima et. al., *J. Am. Chem. Soc.*, 131, 6050-6051 (2009).
Non Patent Document 3: F. Hao et al., *Nat. Photonics*, 8, 489-494 (2014).

SUMMARY OF THE INVENTION

Problems to be Solved by the Invention

As disclosed in Non-Patent Document 2, a perovskite crystal material exhibits spectral sensitivity characteristics at wavelengths shorter than 800 nm, and thus absorbs little infrared light having wavelengths greater than 800 nm. Thus, in practical use of a perovskite solar cell, it is important to effectively use long-wavelength light. For example, a combination of a perovskite solar cell and a solar cell having a bandgap narrower than that of the perovskite solar cell allows long-wavelength light to be used by the solar cell having a narrower bandgap. This is thought to achieve a solar cell with higher efficiency.

One known photoelectric conversion device including a combination of multiple photoelectric conversion units (solar cells) is a tandem-type photoelectric conversion device in which photoelectric conversion units having different bandgaps are stacked. A tandem-type photoelectric conversion device includes a photoelectric conversion unit (front cell) having a wider bandgap provided on a light-incident side, and a photoelectric conversion unit (rear cell) having a narrower bandgap provided at the rear side of the front cell.

A tandem-type photoelectric conversion device including a combination of a perovskite-type solar cell (hereinafter, also referred to as a perovskite-type photoelectric conversion unit) and another photoelectric conversion unit has rarely been reported previously. Thus, there is currently no useful finding for effectively utilizing long-wavelength light by means of a combination of a perovskite-type photoelectric conversion unit and another photoelectric conversion unit.

In view of the foregoing, an object of the present invention is to provide a high-efficiency tandem-type photoelectric conversion device including a combination of a perovskite-type photoelectric unit and another photoelectric conversion unit. Another object of the present invention is to provide a photoelectric conversion module including the above photoelectric conversion device.

Means for Solving the Problem

Examples of the solar cell in which the bandgap of a light absorbing layer is narrower than the bandgap of a light absorbing layer in a perovskite-type solar cell include solar cells in which a light absorbing layer is made of crystalline silicon. In particular, a heterojunction solar cell with a silicon-based thin-film provided on both surfaces of a p-type or n-type single-crystalline silicon substrate is known to have high conversion efficiency.

Thus, it is considered that high conversion efficiency is attained by preparing a tandem-type photoelectric conversion device in which a perovskite-type photoelectric conversion unit is disposed on the light-incident side, and a heterojunction solar cell (hereinafter, also referred to as a heterojunction photoelectric conversion unit) is disposed in the rear of the perovskite-type photoelectric conversion unit.

When a heterojunction solar cell is used singly, a phase of reflected light at an air-transparent conductive layer interface and a phase of a reflected light at an interface between transparent conductive layer and silicon-based thin-film are mutually canceled by adjusting the thickness of a transparent conductive layer, etc., so that the amount of light captured in the heterojunction solar cell can be increased. On the other hand, when a perovskite-type photoelectric conversion unit is disposed in front of a heterojunction photoelectric conversion unit, reflection at an interface between a perovskite-type photoelectric conversion unit and a transparent conductive layer is low, and therefore reflection at an interface between transparent conductive layer and silicon-based thin-film is more noticeable as compared to the case of a heterojunction solar cell alone. Accordingly, light may be reflected to the perovskite-type photoelectric conversion unit, leading to a decrease in the amount of light captured in the heterojunction photoelectric conversion unit.

Thus, in a photoelectric conversion device with a heterojunction photoelectric conversion unit etc. disposed in the rear of a perovskite-type photoelectric conversion unit, it is necessary to consider reducing reflection of light to the perovskite-type photoelectric conversion unit to increase the amount of light captured in the rear photoelectric conversion unit, unlike a case where a photoelectric conversion unit is used singly.

The present invention relates to a tandem-type photoelectric conversion device including a first photoelectric conversion unit and a second photoelectric conversion unit in this order from the light-incident side. The first photoelectric conversion unit is a perovskite-type photoelectric conversion unit, and has a light absorbing layer containing a photosensitive material of perovskite-type crystal structure represented by the general formula $R^1NH_3M^1X_3$ or $HC(NH_2)_2M^1X_3$.

In the second photoelectric conversion unit, the bandgap of the light absorbing layer is narrower than the bandgap of the light absorbing layer in the first photoelectric conversion unit. In other words, the second photoelectric conversion unit is a solar cell capable of utilizing light having a longer wavelength as compared to the perovskite-type photoelectric conversion unit. Examples of the material of the light absorbing layer in the second photoelectric conversion unit include crystalline silicon (single-crystalline, polycrystalline and microcrystalline), and chalcopyrite-based compounds such as $CuInSe_2$ (CIS).

In the photoelectric conversion device according to the present invention, an anti-reflection layer and a transparent conductive layer are provided in this order from the light-incident side between the first photoelectric conversion unit and the second photoelectric conversion unit. The anti-reflection layer and the transparent conductive layer are in contact with each other, and the refractive index of the anti-reflection layer is lower than the refractive index of the transparent conductive layer.

The refractive index of the anti-reflection layer is preferably 1.2 to 1.7. The thickness of the anti-reflection layer is preferably 1 to 250 nm.

In one embodiment, the second photoelectric conversion unit includes a crystalline silicon substrate as the light absorbing layer, and the crystalline silicon substrate has a textured surface comprising a plurality of projections or recesses such as pyramidal projections or recesses. The height of the projections or recesses is preferably 0.5 to 3 μm.

In one embodiment, the area W1 of the first photoelectric conversion unit and the area W2 of the second photoelectric conversion unit satisfy the relationship of W1<W2. In this case, it is preferable that the area Wt of the transparent conductive layer satisfies the relationship of W1<Wt≤W2. It is preferable that the area Wa of the anti-reflection layer satisfies the relationship of W1<Wa≤Wt.

In the embodiments described above, it is preferable that the first photoelectric conversion unit formed region does not overlap with the peripheral edge of a light-incident-side surface of the second photoelectric conversion unit.

The present invention also relates to a photoelectric conversion module including the photoelectric conversion device.

Effects of the Invention

In the present invention, a tandem-type photoelectric conversion device excellent in utilization efficiency of long-wavelength light and capable of utilizing light in a wide wavelength range for photoelectric conversion can be obtained by stacking a perovskite-type photoelectric conversion unit and other photoelectric conversion unit. Further, by providing a specific anti-reflection layer between the perovskite-type photoelectric conversion unit and a transparent conductive layer, reflection of light to the perovskite-type photoelectric conversion unit can be reduced to increase the amount of light captured in the rear photoelectric conversion unit.

DESCRIPTION OF EMBODIMENTS

Hereinafter, embodiments of the present invention will be described with reference to the drawings. The photoelectric conversion device of the present invention is not limited to the following embodiments.

In each drawing, dimensional relations of thickness, length and so on are appropriately changed for clarification and simplification of the drawings, and do not reflect actual dimensional relations. In the drawings, same reference characters represent same or similar technical items.

Figure 1:
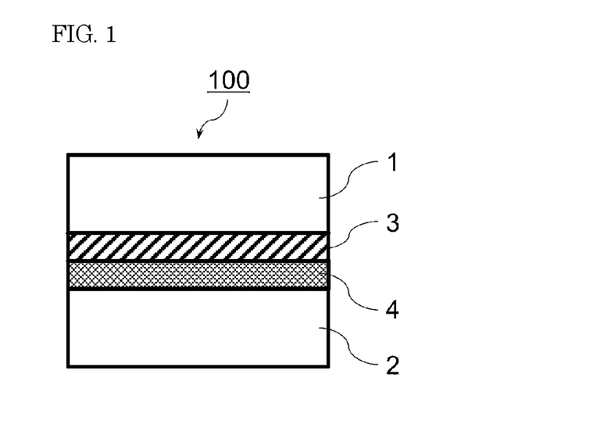
FIG. 1 is a schematic sectional view of a photoelectric conversion device according to one embodiment of the present invention.

FIG. 1 is a schematic sectional view of a photoelectric conversion device according to one embodiment of the present invention. The photoelectric conversion device 100 in FIG. 1 is a tandem-type photoelectric conversion device in which a first photoelectric conversion unit 1 and a second photoelectric conversion unit 2 are stacked in this order from the light-incident side.

The first photoelectric conversion unit 1 is a perovskite-type photoelectric conversion unit, which contains a photosensitive material having a perovskite-type crystal structure (perovskite crystal material) in a light absorbing layer. The compound that forms a perovskite crystal material is represented by a general formula $R^1NH_3M^1X_3$ or $HC(NH_2)_2 M^1X_3$. $R^1$ is an alkyl group, preferably an alkyl group having 1 to 5 carbon atoms, and particularly preferably a methyl group. $M^1$ is a divalent metal ion, and preferably Pb or Sn. X is a halogen, such as F, Cl, Br, or I. The three elements X may be a same halogen element, or a mixture of different halogen elements. Changing halogens and/or a ratio between halogens can change the spectral sensitivity characteristics.

The bandgap of the light absorbing layer 11 in the first photoelectric conversion unit 1 is preferably 1.55 to 1.75 eV, more preferably 1.6 to 1.65 eV for making current matching between photoelectric conversion units. For example, when the perovskite crystal material is represented by the formula $CH_3NH_3PbI_{3-x}Br_x$, x is preferably about 0 to 0.85 for ensuring that the bandgap is 1.55 to 1.75 eV, and x is preferably about 0.15 to 0.55 for ensuring that the bandgap is 1.60 to 1.65 eV.

The configuration of the first photoelectric conversion unit (perovskite-type photoelectric conversion unit) is not particularly limited, and examples thereof include a configuration in which an electron transporting layer, a light absorbing layer and a hole transporting layer are provided in this order.

The second photoelectric conversion unit 2 is a photoelectric conversion unit having a bandgap narrower than that of the first photoelectric conversion unit 1. The configuration of the second photoelectric conversion unit 2 is not particularly limited as long as the bandgap of the light absorbing layer thereof is narrower than the bandgap of the light absorbing layer in the first photoelectric conversion unit 1. Examples of material for the light absorbing layer that satisfies such condition include crystalline silicon, gallium arsenide (GaAs), and CuInSe$_2$ (CIS). Among these, crystalline silicon and CIS are preferably used in view of high utilization efficiency of long-wavelength light (particularly infrared light having wavelengths of 1000 nm or longer). Crystalline silicon may be single-crystalline, polycrystalline, or microcrystalline. In particular, due to high utilization efficiency of long-wavelength light and excellent carrier collection efficiency, a photoelectric conversion unit having a single-crystalline silicon substrate as the light absorbing layer is preferably used.

Examples of photoelectric conversion unit having a single-crystalline silicon substrate include one in which an n-type layer is provided on the light-incident side, and a highly doped region (p$^+$ region) is provided on the rear side, of a p-type single-crystalline silicon substrate; and one in which an amorphous silicon layer and a transparent electrically-conductive layer are provided on each side of a p-type or n-type single-crystalline silicon substrate (so called heterojunction silicon solar cell). In particular, the solar cell that forms the second photoelectric conversion unit is preferably a heterojunction solar cell because of its high conversion efficiency. The configuration, material and the like of the second photoelectric conversion unit are not limited to those described above example as long as long-wavelength light-incident preferentially to the second photoelectric conversion unit can be effectively utilized.

An anti-reflection layer 3 and a transparent conductive layer 4 are provided in this order from the light-incident side between the first photoelectric conversion unit 1 and the second photoelectric conversion unit 2. The anti-reflection layer 3 and the transparent conductive layer 4 are in contact with each other.

The transparent conductive layer 4 provided between the first photoelectric conversion unit 1 and the second photoelectric conversion unit 2 has a function as an intermediate layer which capturing and recombining holes and electrons generated in the two photoelectric conversion units 1 and 2. It is therefore preferable that the transparent conductive layer 4 has sufficient conductivity. Preferably, the transparent conductive layer 4 has transparency for ensuring that light is transmitted to arrive at the second photoelectric conversion unit.

Thus, the transparent conductive layer 4 preferably has a conductive oxide as a main component. As the conductive oxide, for example, zinc oxide, indium oxide and tin oxide may be used alone or in complex oxide. From the viewpoints of electroconductivity, optical characteristics and long-term reliability, indium-based oxides including indium oxide are preferable. Among them, those having indium tin oxide (ITO) as a main component are more suitably used. The wording "as a main component" in this specification means that the content is more than 50% by weight, preferably 70% by weight or more, more preferably 85% by weight or more.

A dopant may be added to the transparent conductive layer 4. For example, when zinc oxide is used for the transparent conductive layer, examples of the dopant include aluminum, gallium, boron, silicon and carbon. When indium oxide is used for the transparent conductive layer, examples of the dopant include zinc, tin, titanium, tungsten, molybdenum and silicon. When tin oxide is used for the transparent conductive layer, examples of the dopant include fluorine.

The thickness of the transparent conductive layer 4 is preferably set to 10 nm or more and 140 nm or less, in view of transparency, electroconductivity, and reduction of light reflection. The transparent conductive layer 4 may be a single layer or a layered structure composed of multiple layers.

The refractive index of the interface on the rear side of the first photoelectric conversion unit containing perovskite-type CH$_3$NH$_3$PbI$_3$ etc. in the light absorbing layer is about 2.5 (refractive index of titanium oxide), and the refractive index of the transparent conductive layer is about 1.9 (refractive index of ITO). When the second photoelectric conversion unit is a heterojunction photoelectric conversion unit, the refractive index of the interface on the light-incident side of the second photoelectric conversion unit is about 4.5 (refractive index of amorphous silicon). When an anti-reflection layer is not provided between the first photoelectric conversion unit and the second photoelectric conversion unit, and the first photoelectric conversion unit and the transparent conductive layer are in contact with each other, it is difficult to cancel reflected light at the interface between the transparent conductive layer and the second photoelectric conversion unit because reflection at the interface between the first photoelectric conversion unit and the transparent conductive layer is low. As a result, light is reflected to the first photoelectric conversion unit, leading to a decrease in the amount of light captured in the second photoelectric conversion unit disposed at rear side.

In the photoelectric conversion device 100, the anti-reflection layer 3 having a refractive index lower than the refractive index of the transparent conductive layer 4 is provided between the first photoelectric conversion unit 1 and the transparent conductive layer 4. By providing the anti-reflection layer 3 between the first photoelectric conversion unit 1 and the transparent conductive layer 4, reflection at the interface between the first photoelectric conversion unit 1 and the anti-reflection layer 3, reflection at the interface between the anti-reflection layer 3 and the transparent conductive layer 4, and reflection at the interface between the transparent conductive layer 4 and the second photoelectric conversion unit 2 can be combined to cancel reflected light at the interface between the transparent conductive layer 4 and the second photoelectric conversion unit 2. As a result, reflection of light to the first photoelectric conversion unit 1 can be reduced to increase the amount of light captured in the second photoelectric conversion unit 2.

The refractive index of the anti-reflection layer 3 is preferably 1.2 to 1.7, more preferably 1.2 to 1.6, further preferably 1.2 to 1.5.

The thickness of the anti-reflection layer 3 is preferably 1 nm to 250 nm, more preferably 10 nm to 250 nm, further preferably 80 nm to 220 nm, especially preferably 100 nm to 200 nm.

In this specification, the refractive index of the anti-reflection layer is a refractive index to light having a wavelength of 600 nm. The refractive index is measured by spectroscopic ellipsometry. The thickness of the anti-reflection layer is determined by transmission electron microscope (TEM) observation of a cross-section. The refractive index and the thickness of each of other layers are measured in the same manner as described above. When a layer is formed on a surface of a silicon substrate etc. which has a plurality of projections or recesses such as a texture, a direction perpendicular to the slope of the projections or recesses is defined as a thickness direction.

Preferably, the anti-reflection layer 3 has transparency and conductivity similarly to the transparent conductive layer 4 because it also serves an intermediate layer provided between two photoelectric conversion units 1 and 2.

It is therefore preferable that the anti-reflection layer 3 is mainly composed of an electroconductive polymer. As the electroconductive polymer, for example, one or more of polythiophene derivatives such as poly(3,4-ethylenedioxythiophene) (PEDOT) and poly(3,4-ethylenedioxythiophene)/polystyrene sulfonate (PEDOT/PSS), polyalkylene imines such as polyethylene imine (PEI), modified polyalkylene imines such as ethoxylated polyethylene imine (PEIE), polyacetylene, polyparaphenylene, polypyrrole, polyaniline and the like can be used. PEDOT/PSS is a polythiophene derivative obtained by doping poly(3,4-ethylenedioxythiophene) (PEDOT) with polyethylene sulfonic acid (PSS). In particular, it is preferable that the anti-reflection later 3 is mainly composed of PEDOT/PSS. Particularly, the second photoelectric conversion unit 2 is a heterojunction photoelectric conversion unit, and a conductive silicon-based thin-film 24 on the light-incident side has n-type conductivity, the anti-reflection layer 3 mainly composed of PEDOT/PSS suitably functions as an intermediate layer which recombines holes generated in the second photoelectric conversion unit 2 and electrons generated in the first photoelectric conversion unit 1. The anti-reflection layer 3 may contain other components as long as the effect of the present invention is not impaired.

The anti-reflection layer 3 may be mainly composed of an insulating polymer or an insulating inorganic material. For example, a region on which the anti-reflection layer 3 is formed and a region on which a grid electrode is formed may be provided on the transparent conductive layer 4 to connect the first photoelectric conversion unit 1 and the second photoelectric conversion unit 2 through the grid electrode. Alternatively, electroconductive nanoparticles composed of silver etc. can be included in the anti-reflection layer 3 to connect the first photoelectric conversion unit 1 and the second photoelectric conversion unit 2. As the insulating polymer, for example, an acrylic resin such as polymethylmethacrylate (PMMA) may be used. As the insulating inorganic material, for example, an inorganic halide such as $MgF_2$, LiF or NaF may be used.

The anti-reflection layer 3 may be a single layer, or may have a stacking configuration with a plurality of layers. For example, when the anti-reflection layer 3 is composed of a plurality of thin-films having different refractive indices, an interference of light is produced, so that a part of light arriving at the anti-reflection layer 3 may be reflected to the first photoelectric conversion unit 1, and the remaining light may be transmitted through the second photoelectric conversion unit 2. When the anti-reflection layer 3 includes a plurality of layers, the refractive index of a layer that is in contact with the transparent conductive layer 4 is preferably 1.2 to 1.7, and the total thickness is preferably 1 to 250 nm. When a charge transporting layer (electron transporting layer or hole transporting layer) is formed on the light-incident side of the anti-reflection layer 3 in such a manner that the charge transporting layer is in contact with the anti-reflection layer 3, the charge transporting layer mainly composed of a material having a low refractive index (about 1.2 to 1.7) can be considered as an anti-reflection layer. In this case, the total thickness of the anti-reflection layer 3 including the charge transporting layer is preferably 1 to 250 nm.

Hereinafter, preferred embodiments where a heterojunction solar cell is used as a solar cell that forms the second photoelectric conversion unit will be described.

Embodiment 1

Figure 2:
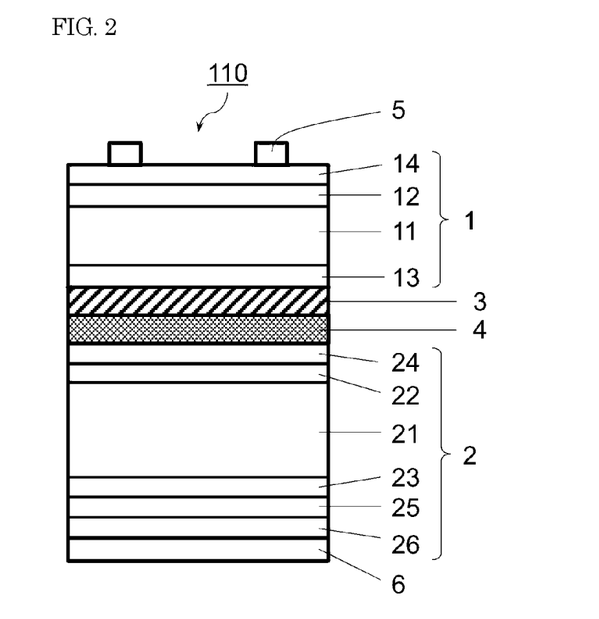
FIG. 2 is a schematic sectional view of a photoelectric conversion device according to embodiment 1.

FIG. 2 is a schematic sectional view of a photoelectric conversion device according to embodiment 1. In a photoelectric conversion device 110 shown in FIG. 2, a collecting electrode 5, a first photoelectric conversion unit 1, an anti-reflection layer 3, a transparent conductive layer 4, a second photoelectric conversion unit 2 and a rear electrode 6 are disposed in this order from the light-incident side. In the photoelectric conversion device 110 according to embodiment 1, the area of the first photoelectric conversion unit 1 is equal to the area of the second photoelectric conversion unit 2.

In this specification, the area of the photoelectric conversion unit is a plane projected area in front view of the solar cell. When the photoelectric conversion unit includes layers having different plane projected areas, the plane projected area of the light absorbing layer is defined as an area of the photoelectric conversion unit.

As described later, the first photoelectric conversion unit 1 is prepared by a process using a solution etc. Thus, it is preferable that the photoelectric conversion device 110 shown in FIG. 2 is produced by preparing the second photoelectric conversion unit 2, and thereafter stacking the transparent conductive layer 4, the anti-reflection layer 3 and the first photoelectric conversion unit 1 on the second photoelectric conversion unit 2. Hereinafter, specific configurations of the second photoelectric conversion unit 2, the transparent conductive layer 4, the anti-reflection layer 3 and the first photoelectric conversion unit 1 will be described in the order.

(Second Photoelectric Conversion Unit)

The second photoelectric conversion unit 2 is a heterojunction photoelectric conversion unit in which conductive silicon-based thin-films 24 and 25 each having a bandgap different from that of a single-crystalline silicon are provided on surfaces of a single-crystalline silicon substrate 21. One of the conductive silicon-based thin-films 24 and 25 is p-type, and the other is n-type.

The conductivity-type of the single-crystalline silicon substrate 21 may be either an n-type or a p-type. In comparison between electron and hole, electron has a higher mobility, and thus when the silicon substrate 21 is an n-type single-crystalline silicon substrate, the conversion characteristic is particularly high.

Preferably, the silicon substrate 21 has a plurality of projections or recesses such as a texture on at least a surface at the light-incident side, preferably both surfaces. By forming the projections or recesses such as a texture on a surface of the silicon substrate, reflection of light to the first photoelectric conversion unit 1 can be reduced. Texture can be formed, for example, by an anisotropic etching technique. Texture formed by anisotropic etching has tetragonal pyramid-shaped textured structure.

The height of the projections or recesses on the surface of the silicon substrate 21 is preferably 0.5 μm or more, more preferably 1 μm or more. The height of the projections or recesses is preferably 3 μm or less, more preferably 2 μm or less. When the height of the projections or recesses is in the above-mentioned range, the reflectance of a surface of the substrate can be reduced to increase a short circuit current. The height of the projections or recesses on the surface of the silicon substrate 21 is determined by a height difference between the peak of the projection and the valley of the recess.

As the conductive silicon-based thin-films 24 and 25 of p-type or n-type, amorphous silicon, microcrystalline silicon (material including amorphous silicon and crystalline silicon), amorphous silicon alloy and microcrystalline silicon alloy may be used. Examples of the silicon alloy include silicon oxide, silicon carbide, silicon nitride silicon germanium and the like. Among the above, conductive silicon-based thin-film is preferably an amorphous silicon thin-film.

When the second photoelectric conversion unit 2 is a heterojunction photoelectric conversion unit, it is preferable that the photoelectric conversion unit includes intrinsic silicon-based thin-films 22 and 23 between the single-crystalline silicon substrate 21 and the conductive silicon-based thin-films 24 and 25. By providing the intrinsic silicon-based thin-film on the surface of the single-crystalline silicon substrate, surface passivation can be effectively performed while diffusion of impurities to the single-crystalline silicon substrate is suppressed. For effectively performing surface passivation of the single-crystalline silicon substrate 21, the intrinsic silicon-based thin-films 22 and 23 are preferably intrinsic amorphous silicon thin-films.

The above intrinsic silicon-based thin-films 22 and 23, and conductive silicon-based thin-films 24 and 25 are preferably formed by a plasma-enhanced CVD method.

(Transparent Conductive Layer)

A transparent conductive layer 26 mainly composed of a conductive oxide is formed on the rear side conductive silicon-based thin-film 25. In this way, the second photoelectric conversion unit 2 is prepared.

Similarly, the transparent conductive layer 4 mainly composed of a conductive oxide is formed on the conductive silicon-based thin-film 24 on the light-incident side. The transparent conductive layer 4 also functions as an intermediate layer between the first photoelectric conversion unit 1 and the second photoelectric conversion unit 2.

The above transparent conductive layers are formed by a dry process (a CVD method or a PVD method such as a sputtering method or an ion plating method). A PVD method such as a sputtering method or an ion plating method is preferred for formation of a transparent conductive layer mainly composed of an indium-based oxide.

(Anti-Reflection Layer)

The anti-reflection layer 3 is formed on the transparent conductive layer 4. The anti-reflection layer 3 is formed by, for example, a spin coating method or the like using a solution containing an electroconductive polymer such as the PEDOT/PSS, and an insulating polymer. The anti-reflection layer 3 composed of $MgF_2$ etc. is formed by a sputtering method, a vacuum vapor deposition method or the like.

(First Photoelectric Conversion Unit)

The first photoelectric conversion unit 1 includes a transparent conductive layer 14, a first charge transporting layer 12, a light absorbing layer 11 and a second charge transporting layer 13 in this order from the light-incident side. One of the first charge transporting layer 12 and the second charge transporting layer 13 is a hole transporting layer, and the other is an electron transporting layer.

For example, when the silicon substrate 21 is an n-type single-crystalline silicon substrate in the second photoelectric conversion unit 2, the conductivity-type of conductive silicon-based thin-films 24 and 25 is preferably a p-type on the light-incident side and an n-type on the rear side. In this case, in the first photoelectric conversion unit 1, the first charge transporting layer 12 on the light-incident side is a hole transporting layer, and the second charge transporting layer 13 on the rear side is an electron transporting layer.

Hereinafter, described is a method for preparing the first photoelectric conversion unit 1 by forming the electron transporting layer 13, the light absorbing layer 11, the hole transporting layer 12 and the transparent conductive layer 14 in this order on the anti-reflection layer 3.

The electron transporting layer 13 is formed on the anti-reflection layer 3. Reflection of light to the first photoelectric conversion unit 1 may be reduced by adjusting the refractive index of the electron transporting layer 13 formed on the anti-reflection layer 3 as described above. As a material of the electron transporting layer, a known material may be appropriately selected, and examples thereof include titanium oxide, zinc oxide, niobium oxide, zirconium oxide and aluminum oxide.

The electron transporting layer may contain a donor. For example, when titanium oxide is used for the electron transporting layer, examples of the donor include yttrium, europium and terbium.

The electron transporting layer may be a dense layer having a smooth structure, or a porous layer having a porous structure. When the electron transporting layer has a porous structure, the pore size is preferably on the nanoscale. Preferably, the electron transporting layer has a porous structure for increasing the active surface area of the light absorbing layer to improve collectiveness of electrons by the electron transporting layer.

The electron transporting layer may be a single layer, or may have a stacking configuration with a plurality of layers. For example, the electron transporting layer may have a double layer structure in which a dense layer is provided on the second photoelectric conversion unit 2-side, and a porous layer is provided on the first the light absorbing layer 11-side of the photoelectric conversion unit 1. The thickness of the electron transporting layer is preferably 1 nm to 200 nm.

The electron transporting layer 13 is formed by, for example, a spraying method etc. using a solution containing the electron transporting material such as titanium oxide.

The light absorbing layer 11 is formed on the electron transporting layer 13. The light absorbing layer 11 is formed by, for example, a spin coating method etc. using a solution containing a perovskite crystal material represented by the general formula $R^1NH_3M^1X_3$ or $HC(NH_2)_2M^1X_3$.

The hole transporting layer 12 is formed on the light absorbing layer 11. As a material of the hole transporting layer, a known material may be appropriately selected, and examples thereof include polythiophene derivatives such as poly-3-hexylthiophene (P3HT) and poly(3,4-ethylenedioxythiophene) (PEDOT), fluorene derivatives such as 2,2',7,7'-tetrakis-(N, N-di-p-methoxyphenylamine)-9,9'-spirobifluorene (Spiro-OMeTAD), carbazole derivatives such as polyvinyl carbazole, triphenylamine derivatives, diphenylamine derivatives, polysilane derivatives and polyaniline derivatives. Examples of the material of the hole transporting layer include metal oxides such as $MoO_3$, $WO_3$ and NiO.

The hole transporting layer may be a single layer, or may have a stacking configuration with a plurality of layers. The thickness of the hole transporting layer is preferably 1 nm to 100 nm.

The hole transporting layer 12 is formed by, for example, a spraying method etc. using a solution containing the hole transporting material such as Spiro-OMeTAD.

Preferably, the transparent conductive layer 14 mainly composed of a conductive oxide is formed on the hole transporting layer 12. Since the configuration of the transparent conductive layer 14 and the method for forming the transparent conductive layer 14 are the same as the configuration of the transparent conductive layer 4 and the method for forming the transparent conductive layer 4, the detailed descriptions thereof are omitted. In this way, the first photoelectric conversion unit 1 is prepared.

(Metal Collecting Electrode)

Preferably, the photoelectric conversion device 110 shown in FIG. 2 includes metal collecting electrodes 5 and 6 on transparent conductive layers 14 and 26, respectively, for effectively extracting photo carriers. The collecting electrode on the light-incident side is formed in a predetermined pattern shape. The collecting electrode on the rear side may be formed in a pattern shape, or formed on substantially the entire surface of the transparent conductive layer. In the embodiment shown in FIG. 2, the collecting electrode 5 is formed in a pattern shape on the transparent conductive layer 14 on the light-incident side, and the rear electrode 6 is formed on the entire surface of the transparent conductive layer 26 on the rear side.

Examples of the method for forming a metal electrode on the entire surface of a transparent conductive layer include dry processes such as various kinds of PVD methods and CVD methods, application of a paste, and a plating method. For the rear electrode, it is desirable to use a material which has a high reflectivity of light having a wavelength in a near-infrared to infrared range and which has high electroconductivity and chemical stability. Examples of the material having the above-mentioned properties include silver, copper and aluminum.

The patterned collecting electrode is formed by a method of applying an electroconductive paste, a plating method, or the like. When an electroconductive paste is used, the collecting electrode is formed by ink-jetting, screen printing, spraying or the like. Screen printing is preferable from the viewpoint of productivity. In screen printing, a process of applying an electroconductive paste containing metallic particles and a resin binder by screen printing is preferably used.

When a collecting electrode is formed in a pattern shape by a plating method, it is preferable that a metal seed layer is formed in a pattern shape on the transparent conductive layer, and a metal layer is then formed by a plating method with the metal seed layer as an origination point. In this method, it is preferable that an insulating layer is formed on the transparent conductive layer for suppressing deposition of a metal on the transparent conductive layer.

The photoelectric conversion device 110 can be prepared through the steps described above.

Embodiment 2

Figure 3:
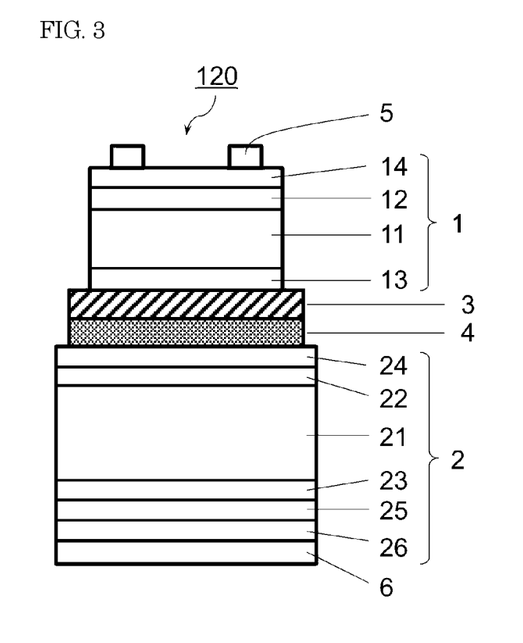
FIG. 3 is a schematic sectional view of a photoelectric conversion device according to embodiment 2.

FIG. 3 is a schematic sectional view of a photoelectric conversion device according to embodiment 2. In a photoelectric conversion device 120 according to embodiment 2, the area of a first photoelectric conversion unit 1 is smaller than the area of a second photoelectric conversion unit 2. Otherwise, there is no difference in configuration between embodiment 1 and embodiment 2.

Figure 4:
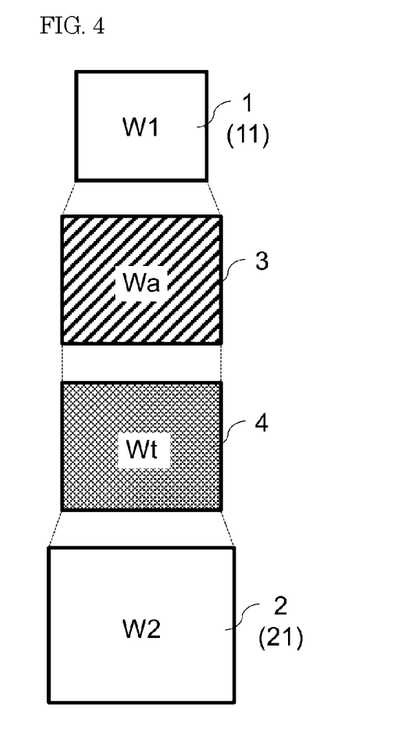
FIG. 4 is an exploded plan view schematically showing the photoelectric conversion device in FIG. 3.

FIG. 4 is an exploded plan view schematically showing the photoelectric conversion device in FIG. 3. In FIG. 4, the area W1 of the first photoelectric conversion unit 1 and the area W2 of the second photoelectric conversion unit 2 satisfy the relationship of W1<W2. Further, the area Wa of the anti-reflection layer 3 and the area Wt of the transparent conductive layer 4 satisfy the relationship of W1<Wa=Wt<W2.

As described in embodiment 1, the first photoelectric conversion unit 1 is prepared on the second photoelectric conversion unit 2 by a process using a solution etc. Thus, when the area W1 of the first photoelectric conversion unit 1 is smaller than the area W2 of the second photoelectric conversion unit 2, physical contact between the second photoelectric conversion unit 2 and the first photoelectric conversion unit 1 can be prevented, so that deterioration of characteristics by a short-circuit can be prevented.

The power generation amount in the first photoelectric conversion unit 1 is larger than the power generation amount in the second photoelectric conversion unit 2, and therefore even when the area W1 of the first photoelectric conversion unit 1 is smaller than the area W2 of the second photoelectric conversion unit 2, a decrease in power generation amount is small. On the other hand, when the area W1 of the first photoelectric conversion unit 1 is smaller than the area W2 of the second photoelectric conversion unit 2, the amount of light arriving at the second photoelectric conversion unit 2 can be increased. Thus, even when the area W1 of the first photoelectric conversion unit 1 is small, the power generation amount in the photoelectric conversion device as a whole can be made comparable to that in embodiment 1.

In embodiment 2, it is preferable to satisfy the relationship of W1<Wt≤W2 or W1 δ Wt<W2, and it is more preferable to satisfy the relationship of W1<Wt<W2. It is preferable to satisfy the relationship of W1<Wa≤Wt≤W2 or W1≤Wa≤Wa≤Wt<W2, it is more preferable to satisfy the relationship of W1<Wa≤Wt<W2, and it is further preferable to satisfy the relationship of W1<Wa<Wt<W2. Particularly, when the anti-reflection layer 3 and the transparent conductive layer 4 both have conductivity, deterioration of characteristics by a short-circuit can be prevented by ensuring that the areas of the constituent elements descend from the rear side toward the light-incident side so as to satisfy the relationship of W1<Wa<Wt<W2.

For preventing a short-circuit, it is preferable that the first photoelectric conversion unit 1 is formed in a region, other than the peripheral edge, of a surface of the second photoelectric conversion unit 2 on the light-incident side. It is also preferable that the anti-reflection layer 3 and the transparent conductive layer 4 are formed in a region, other than the peripheral edge, of a surface of the second photoelectric conversion unit 2 on the light-incident side. Further, it is preferable that the anti-reflection layer 3 is formed in a region, other than the peripheral edge, of a surface of the transparent conductive layer 4 on the light-incident side, and it is more preferable that the first photoelectric conversion unit 1 is formed in a region, other than the peripheral edge of a surface of the anti-reflection layer 3 on the light-incident side. In this specification, the "peripheral edge" refers to a region including a peripheral end and extending over a predetermined distance (e.g., several tens μm to several mm) from the peripheral end, and the "peripheral end" refers to an end edge of a principal surface.

Other Embodiments

The magnitude relationship of the area W1 of the first photoelectric conversion unit, the area W2 of the second photoelectric conversion unit, the area Wa of the anti-reflection layer and the area Wt of the transparent conductive layer is not particularly limited. As described in embodiments 1 and 2, it is preferable to satisfy the relationship of W1≤W2, it is more preferable to satisfy the relationship of W1≤Wt≤W2, and it is further preferable to satisfy the relationship of W1≤Wa≤Wt≤W2. When the anti-reflection layer and the transparent conductive layer both have conductivity, deterioration of characteristics by a short-circuit can be prevented by satisfying the relationship of W1≤Wa≤Wt≤W2.

In embodiments 1 and 2, an example has been described in which the second photoelectric conversion unit 2 is a heterojunction photoelectric conversion unit, the conductive silicon-based thin-film 24 on the light-incident side has p-type conductivity, and the conductive silicon-based thin-film 25 on the rear side has n-type conductivity. In the second photoelectric conversion unit 2, the conductive silicon-based thin-film 24 on the light-incident side may have n-type conductivity, and the conductive silicon-based thin-film 25 on the rear side may have p-type conductivity. In this case, in the first photoelectric conversion unit 1, the first charge transporting layer 12 on the light-incident side is an electron transporting layer, and the second charge transporting layer 13 on the rear side is a hole transporting layer. Reflection of light to the first photoelectric conversion unit 1 may be reduced by adjusting the refractive index of a charge transporting layer formed on the anti-reflection layer 3 as described above.

The solar cell that forms the second photoelectric conversion unit is not limited to a heterojunction solar cell as long as it is a solar cell having a bandgap narrower than that of a solar cell that forms the first photoelectric conversion unit as described above.

The configurations of the photoelectric conversion units described in embodiments 1 and 2 are illustrative, and the photoelectric conversion units may include other layers as long as the effect of the present invention is not impaired. Preferably, an anti-reflection film composed of, for example, $MgF_2$ is formed on the transparent conductive layer 4.

In embodiments 1 and 2, a double-junction photoelectric conversion device in which a first photoelectric conversion unit and a second photoelectric conversion unit are stacked in this order has been described as an example, but other stacking configurations can be employed. For example, the photoelectric conversion device according to the present invention may be a triple-junction photoelectric conversion device including other photoelectric conversion unit in the rear of the second photoelectric conversion unit, or may be a quadruple-or-more junction photoelectric conversion device. The bandgap of the light absorbing layer in the photoelectric conversion unit disposed on the rear side is preferably narrower than the bandgap of the light absorbing layer in the photoelectric conversion unit disposed on the front side.

The photoelectric conversion device of the present invention is preferably sealed by a sealing material and modularized when put into practical use. Modularization of the photoelectric conversion device is performed by an appropriate method. For example, a photoelectric conversion module may be obtained by connecting a bus bar via an interconnector such as a TAB to a collecting electrode, a plurality of solar cells are connected in series or in parallel, and encapsulated with an encapsulant and a glass plate.

DESCRIPTION OF REFERENCE CHARACTERS 1 first photoelectric conversion unit
11 light absorbing layer
12, 13 charge transporting layer
2 second photoelectric conversion unit
21 conductive single-crystalline silicon substrate
22, 23 intrinsic silicon-based thin-film
24, 25 conductive silicon-based thin-film
3 anti-reflection layer
4, 14, 26 transparent conductive layer
5 collecting electrode
6 rear electrode
100, 110, 120 photoelectric conversion device

What is claimed is:

1. A tandem-type photoelectric conversion device comprising, arranged in the following order from a light-incident side:
   a first photoelectric conversion unit;
   a PEDOT/PSS anti-reflection layer;
   a first transparent conductive layer; and
   a second photoelectric conversion unit, wherein
   the first photoelectric conversion unit comprises in the following order from the light-incident side:
      a hole transporting layer;
      a light absorbing layer comprising a photosensitive material of perovskite-type crystal structure represented by general formula $R^1NH_3M^1X_3$ or $HC(NH_2)_2 M^1X_3$, wherein $R^1$ is an alkyl group, $M^1$ is a divalent metal ion, and X is a halogen; and
      an electron transporting layer mainly composed of titanium oxide,
   the second photoelectric conversion unit comprises:
      a crystalline silicon substrate; and
      a p-type amorphous silicon semiconductor layer on the light-incident side of the crystalline silicon substrate,
   the anti-reflection layer and the first transparent conductive layer are arranged between the electron transporting layer of the first photoelectric conversion unit and the p-type semiconductor layer of the second photoelectric conversion unit, and
   the anti-reflection layer and the first transparent conductive layer are in contact with each other, and
   a refractive index of the anti-reflection layer is lower than a refractive index of the first transparent conductive layer.

2. The tandem-type photoelectric conversion device according to claim 1, wherein the refractive index of the anti-reflection layer is 1.2 to 1.7.

3. The tandem-type photoelectric conversion device according to claim 1, wherein the anti-reflection layer has a thickness of 1 to 250 nm.

4. The tandem-type photoelectric conversion device according to claim 1, wherein
the crystalline silicon substrate has a textured surface comprising a plurality of projections or recesses.

5. The tandem-type photoelectric conversion device according to claim 4, wherein a height of the plurality of projections or recesses is 0.5 to 3 μm.

6. The tandem-type photoelectric conversion device according to claim 1, wherein an area W1 of the first photoelectric conversion unit and an area W2 of the second photoelectric conversion unit satisfy a relationship of W1≤W2.

7. The tandem-type photoelectric conversion device according to claim 6, wherein an area Wt of the first transparent conductive layer satisfies a relationship of W1<Wt≤W2.

8. The tandem-type photoelectric conversion device according to claim 7, wherein an area Wa of the anti-reflection layer satisfies a relationship of W1<Wa≤Wt.

9. The tandem-type photoelectric conversion device according to claim 6, wherein a region where the first photoelectric conversion unit is formed does not overlap with a peripheral edge of a light-incident-side surface of the second photoelectric conversion unit.

10. A photoelectric conversion module comprising the tandem-type photoelectric conversion device according to claim 1.

11. The tandem-type photoelectric conversion device according to claim 1, further comprising a second transparent conductive layer on a rear side of the second photoelectric conversion unit.

* * * * *